United States Patent [19]

Sakamoto et al.

[11] Patent Number: 5,420,553
[45] Date of Patent: May 30, 1995

[54] NOISE FILTER

[75] Inventors: Yukio Sakamoto; Toshimi Kaneko, both of Kyoto, Japan

[73] Assignee: Murata Manufacturing Co., Ltd., Kyoto, Japan

[21] Appl. No.: 22,360

[22] Filed: Feb. 25, 1993

Related U.S. Application Data

[63] Continuation-in-part of Ser. No. 821,047, Jan. 16, 1992, abandoned.

[30] Foreign Application Priority Data

Jan. 16, 1991 [JP] Japan ..................... 3-3375

[51] Int. Cl.⁶ .............................. H03H 7/06
[52] U.S. Cl. ..................... 333/172; 333/181; 333/185; 338/314
[58] Field of Search ............... 333/172, 184, 185, 181; 338/308, 309, 314, 320

[56] References Cited
U.S. PATENT DOCUMENTS

| | | | |
|---|---|---|---|
| 3,327,255 | 6/1967 | Bolljahn et al. | 333/202 |
| 3,753,161 | 8/1973 | Iwakami | 333/172 X |
| 4,302,737 | 11/1981 | Kausche et al. | 333/172 |
| 4,408,170 | 10/1983 | Rapeli et al. | 333/172 |
| 4,727,351 | 2/1988 | Harris et al. | 338/308 |
| 4,757,285 | 7/1988 | Krause | 333/203 |
| 4,930,215 | 6/1990 | Roche et al. | 29/830 |
| 5,051,712 | 9/1991 | Naito et al. | 333/184 X |
| 5,066,934 | 11/1991 | Ito et al. | 333/205 |
| 5,159,300 | 10/1992 | Nakamura et al. | 333/184 |

*Primary Examiner*—Seungsook Ham
*Attorney, Agent, or Firm*—Birch, Stewart, Kolasch & Birch

[57] ABSTRACT

A noise filter includes a plurality of resistance patterns arranged in parallel, and a ground pattern opposed to the resistance patterns via a dielectric substrate. Distribution capacitance is caused between the resistance patterns and the ground pattern. The function of the noise filter comes from the distribution capacitance and the resistance of the resistance patterns as the RC composite elements. The noise filters can be connected in plural. Noise can be eliminated without twisting the effective signal components in a compact noise filter.

19 Claims, 5 Drawing Sheets

NOISE FILTER

This application is a continuation-in-part of application Ser. No. 07/821,047, filed on Jan. 16, 1992, (Abandoned) the entire contents of which are hereby incorporated by reference.

CROSS-REFERENCE TO RELATED APPLICATIONS

The present invention is a Continuation-in-Part of application Ser. No. 07/821,047, filed on Jan. 16, 1992, the entire contents of which are hereby incorporated by reference.

BACKGROUND OF THE INVENTION

1. Field of the Invention

The present invention relates to a noise filter and, more particularly, to a noise filter for effectively eliminating noise.

2. Description of Related Art

Conventionally, a noise filter comprises an inductance L, and a capacitor C, as shown in an equivalent circuit of FIG. 13, in an LC composite form. In the conventional noise filter, the problem happens that resonance may occur due to the inductance L, and the capacitor C to thereby twist the effective signal components and then cause secondary noise emission due to the twisted signal components.

SUMMARY OF THE INVENTION

With the foregoing in mind, it is an object of the present invention to provide an improved noise filter for effectively eliminating noise without any twist of the signal components and which is suitable for the requirement of compactness of the components.

Briefly described, in accordance with the present invention, a noise filter comprises resistance patterns, a ground pattern, and a dielectric substrate. A plurality of resistance patterns are provided and arranged in parallel with each other. The resistance patterns and the ground pattern are opposed via the dielectric substrate to form the noise filter.

With the arrangement, the distribution capacitance caused between the resistance patterns and the ground pattern, and the respective resistance patterns make a noise filter as the RC composite elements. Since the RC composite elements do not have any inductance component, the noise filter cannot cause any resonance or secondary noise emission. The plurality of resistance patterns arranged in parallel and the opposed ground pattern make up the noise filter. A plurality of noise filters can be provided and arranged. The arranged noise filters can be formed on a single dielectric substrate with a narrow gap between each of the plurality of noise filters. Thus, the present invention enables noise reduction without any twist to the effective signals.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENT

The present invention will be described in detail with reference to the accompanying drawings.

Figure 1:
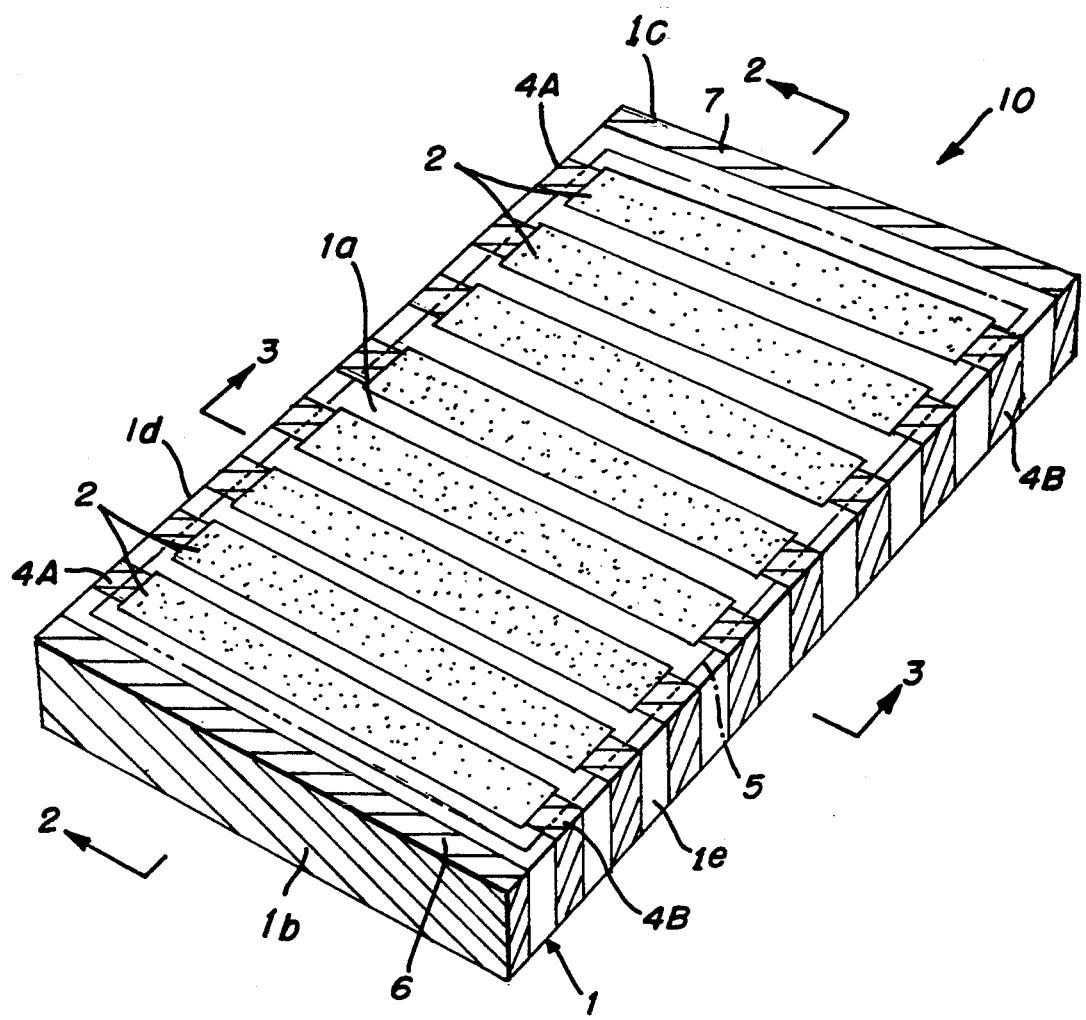
FIG. 1 is a perspective view of a noise filter according to a first preferred embodiment of the present invention.
Figure 2:
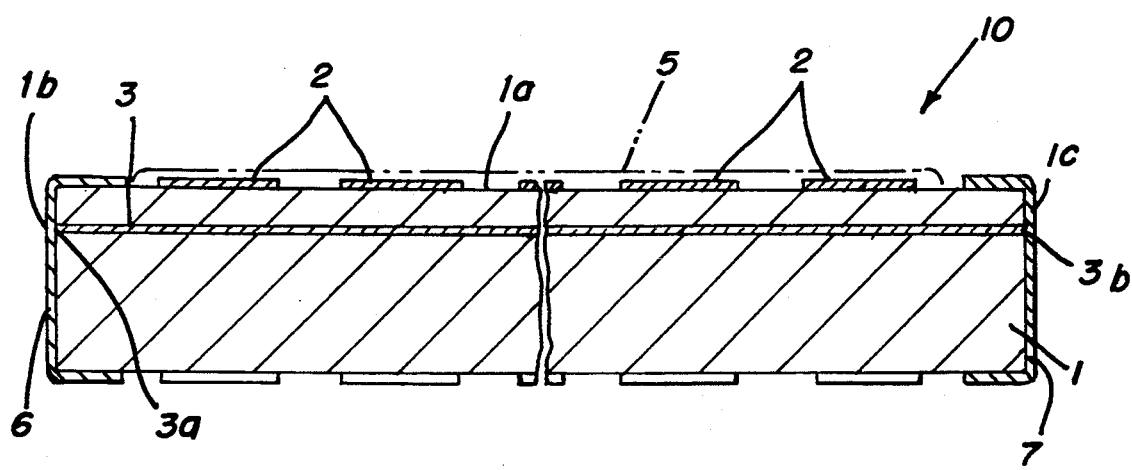
FIG. 2 is a sectional view of the noise filter, taken along the line 2—2 of FIG. 1.
Figure 3:
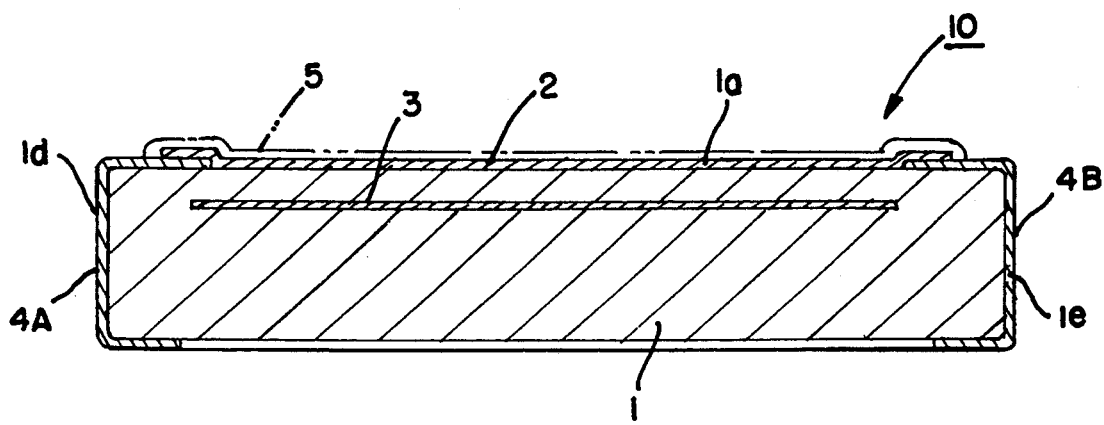
FIG. 3 is a sectional view of the noise filter, taken along the line 3—3 of FIG. 1.

FIG. 1 is a perspective view of a noise filter according to a preferred embodiment of the present invention. FIG. 2 is a sectional view of the noise filter taken along the line 2—2 of FIG. 1. FIG. 3 is a sectional view of the noise filter taken along the line 3—3 of FIG. 1.

A noise filter 10 of the present invention comprises a dielectric substrate 1 of a rectangular form. A plurality of resistance patterns 2 and a ground pattern 3 are mounted on the dielectric substrate 1.

The plurality of resistance patterns 2 are positioned on a front plane 1a of the dielectric substrate 1. They are deposited by sputtering or evaporation in a thin film, and are arranged in parallel with short sides 1b and 1c of the dielectric substrate 1 and in parallel with each other.

The ends of the lengths of the respective resistance patterns 2 reach long sides 1d and 1e of the dielectric substrate 1. Input/output electrodes 4A and 4B are provided on the long sides 1d and 1e, and the respective resistance patterns are connected to the input/output electrodes 4A and 4B. The input/output electrodes 4A and 4B extend toward the back plane of the dielectric substrate 1. The front plane 1a of the dielectric substrate 1 is entirely covered by a dielectric film 5 and the respective resistance patterns 2 are also covered by the dielectric film 5.

As shown in the sectional views of FIGS. 2 and 3, the ground pattern 3 is embedded within the inside of the dielectric substrate 1. That is, the ground pattern 3 is in parallel with the front plane 1a at the inside of the dielectric substrate 1 and rather near to the front plane 1a. Therefore, the ground pattern 3 and the respective resistance patterns 2 are opposed and a bit separated via a part of the volume of the dielectric substrate 1.

The size of the ground pattern 3 covers the region of the plurality of resistance patterns 2. The ends 3a and 3b of the ground pattern 3 reach the short sides 1b and 1c of the dielectric substrate 1 and appear on the sides 1b and 1c. Ground electrodes 6 and 7 are provided on the short sides 1b and 1c for connecting the ground pattern 3.

Figure 4:
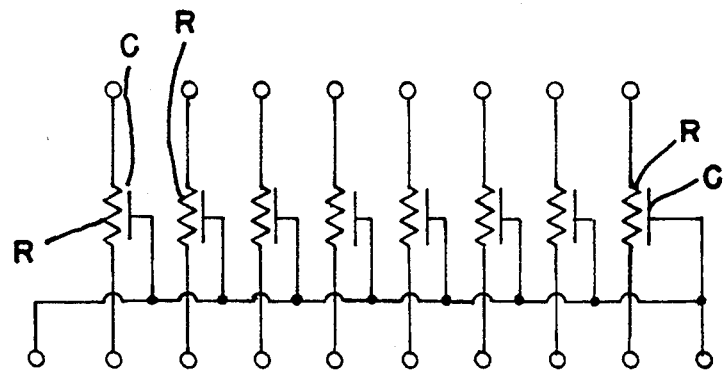
FIG. 4 is an equivalent circuit of the noise filter of FIG. 1.

According to the above arrangement of the noise filter 10, a distribution capacity C is caused between each of the resistance patterns 2 and the ground pattern 3 to make a series of RC composite elements as shown in the equivalent circuit of FIG. 4.

When high frequency signals necessary for the electromagnetic influence (EMI) treatment are inputted into the respective resistance patterns 2, the generation of the distribution capacity C makes the input impedance small to eliminate the noise from the input signals. This circuit does not have any inductance component, so that there is no fear that the signals may be twisted by ringing and the secondary emission of noise may occur.

To alter the pitch of forming the series of RC composite elements, the gap between the resistance patterns 2 should be changed. Thus, the noise filter 10 can be made with the narrow pitch of the series of the resistance patterns 2.

Figure 5:
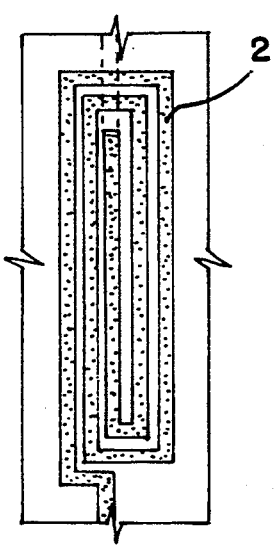
FIG. 5 is a plan view of a resistance pattern according to a second preferred embodiment of the present invention.
Figure 6:
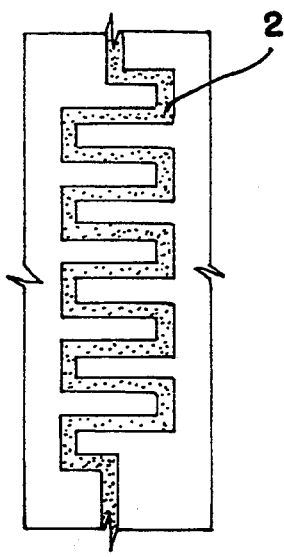
FIG. 6 is a plan view of the resistance pattern according to a third preferred embodiment of the present invention.
Figure 7:
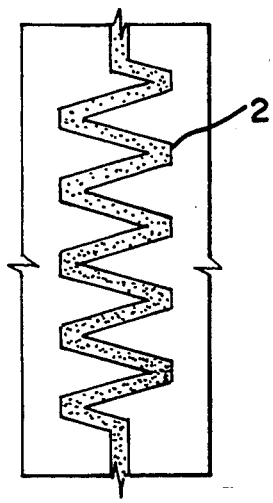
FIG. 7 is a plan view of the resistance pattern according to a fourth preferred embodiment of the present invention.
Figure 13:
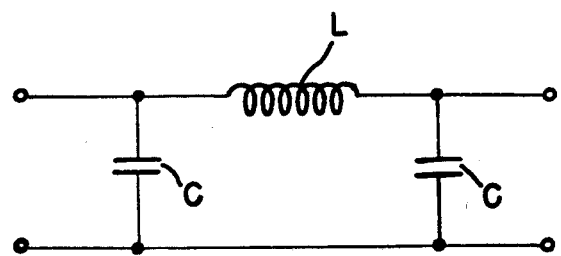
FIG. 13 is an equivalent circuit of a conventional noise filter.

In the first preferred embodiment of the present invention, the respective resistance patterns 2 are formed rectangularly between the long sides 1d and 1e. However, the arrangement of the resistance patterns 2 should not be limited to this. Alternatively, the resistance patterns 2 can be formed in a spiral shape as shown in FIG. 5, in a meander shape of FIG. 6 and in a zigzag shape of FIG. 7.

Further, in the first preferred embodiment of the present invention, the ground pattern 3 is positioned over the entire size of the dielectric substrate 1 by the single plane. It may be possible that the ground pattern 3 may be split into two or more parts along the longitudinal direction.

Figure 8:
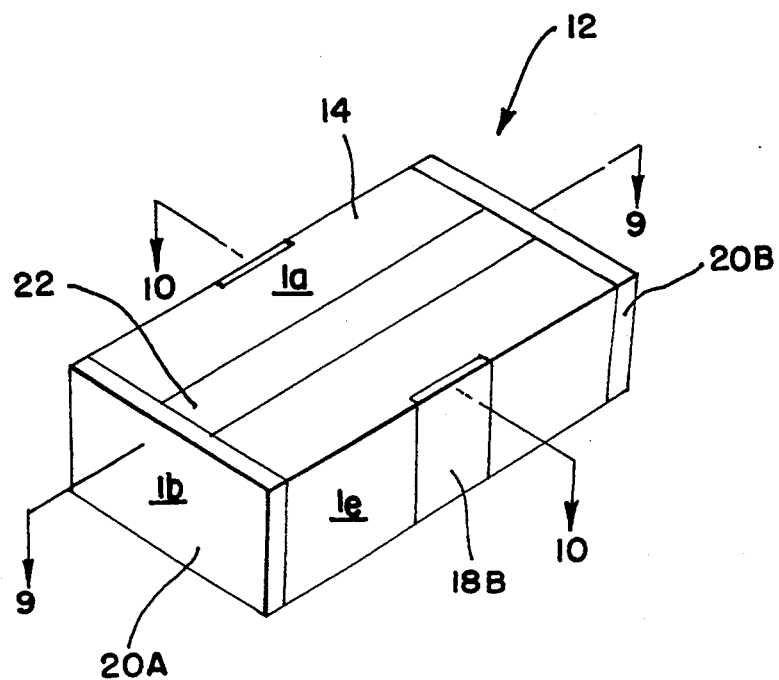
FIG. 8 is a perspective view of a noise filter according to a fifth preferred embodiment of the present invention.

FIG. 8 is a perspective view of a noise filter 12 according to a fifth preferred embodiment of the present invention.

In general, the noise filter according to FIG. 8 is a single-type filter having a first ground pattern 16 within a substrate 14 and a single resistance pattern 22.

Figure 9:
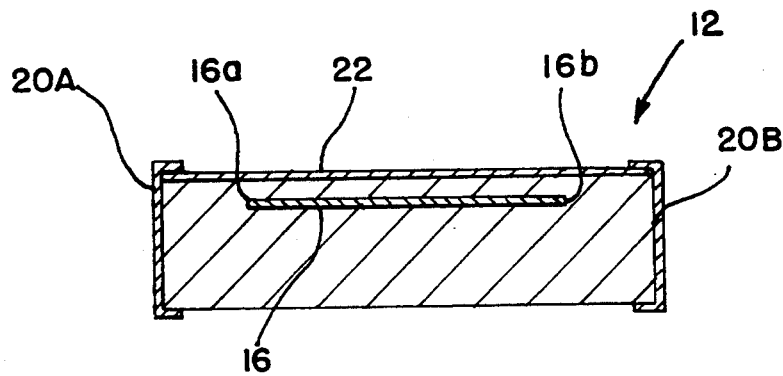
FIG. 9 is a sectional view of the noise filter, taken along line 9—9 of FIG. 8.
Figure 10:
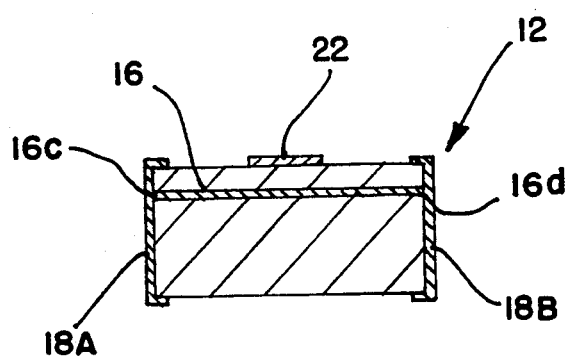
FIG. 10 is a sectional view of the noise filter, taken along line 10—10 of FIG. 8.

More specifically, the noise filter 10 of FIGS. 8-10 comprises a dielectric substrate 14 of a rectangular form. A resistance pattern 22 and a ground pattern 18 are mounted on the dielectric substrate 14.

The resistance pattern 22 is positioned on a front planar surface 1a of the dielectric substrate 14, and is deposited by sputtering or evaporation in a thin film. The resistance pattern 22 is arranged in parallel with the long sides 1d, 1e of the dielectric substrate 14. Input/output electrodes 20A and 20B are provided on the short sides 1b and 1c, and the resistance pattern is connected to the input/output electrodes 20A and 20B. The input/output electrodes 20A and 20B extend toward the back planar surface of the dielectric substrate 14.

As shown in the sectional views of FIGS. 9 and 10, the first ground pattern 16 is embedded within the dielectric substrate 14. That is, the first ground pattern 16 is parallel to the front plane 1a at the inside of the dielectric substrate and adjacent the front plane 1a. Therefore, the first ground pattern 16 and the resistance pattern 22 are slightly separated via a portion of the volume of the dielectric substrate 14.

The size of the first ground pattern 16 covers the region of the resistance pattern 22. The ends 16a and 16b of the first ground pattern 16 are surrounded by the dielectric substrate 14.

Second ground patterns 18A and 18B are provided on the long sides 1d and 1e and the first ground pattern 16 is positioned such that ends 16c and 16d contact with opposing ones of the second ground patterns 18A and 18B, respectively. The second ground patterns 18A and 18B extend toward the front and back planar surfaces of the dielectric substrate 14 as shown in FIG. 10.

Figure 11:
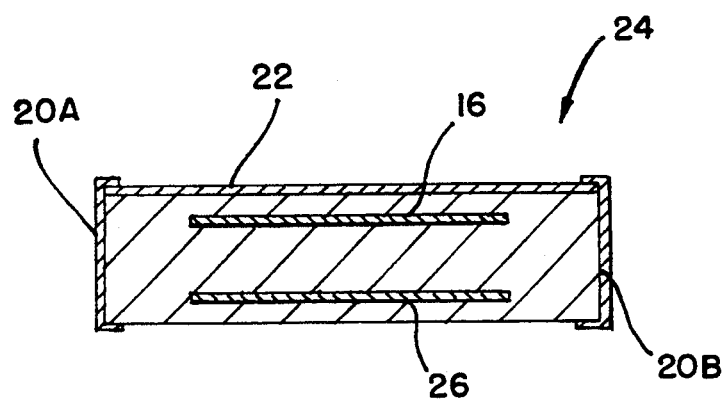
FIG. 11 is a sectional view of a noise filter according to a sixth preferred embodiment of the present invention.
Figure 12:
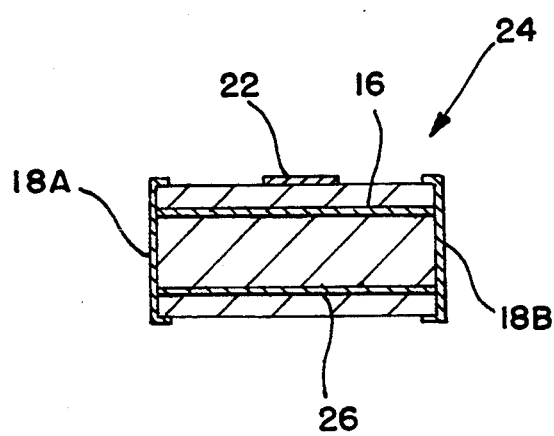
FIG. 12 is a sectional view of the noise filter of FIG. 11.

FIG. 11 is a sectional view of a noise filter 24 according to a sixth preferred embodiment of the present invention.

In general, the noise filter of FIG. 11 corresponds to another single-type filter, having an additional first ground pattern 26 within the dielectric substrate 14. The additional first ground pattern enables the substrate to be set with either of the front or rear planar surface faced toward a machine for forming the resistance pattern. In other words, the necessity for directing a predetermined substrate to the machine is eliminated in the embodiment of FIG. 11.

All elements including the dielectric substrate 14, resistance pattern 22, input/output electrodes 20A and 20B, second ground patterns 18A and 18B are positioned and function as explained above in FIGS. 8-10 and will therefore not be repeated herein. However, a lower first ground pattern 26 is provided parallel to and spaced apart from the upper first ground pattern 16 and adjacent a rear planar surface of the dielectric substrate 14.

As described above, in accordance with the present invention, the noise filter is free of any inductance component, so that resonance and secondary emission of noise twisting the signals cannot occur. The noise filter can remove the noise without any twist of the signals. The noise filter of the present invention is composed of the parallel resistance patterns, and the ground pattern opposed to the resistance patterns via the dielectric substrate, so that the resistance patterns can be connected in plural. The plural resistance patterns can be formed on a single dielectric substrate with the narrow gap therebetween. This enables the noise filter to be compact.

Since the plurality of resistance patterns are mounted on a side of the dielectric substrate and at least one ground pattern is embedded within the dielectric substrate, it is possible to provide a signal line under the noise filter when the noise filter is assembled. Thus, the noise filter can be efficiently assembled and it becomes easy to design the signal line on the assembled substrate.

Each of the plurality of resistance patterns is rectangular and the plurality of resistance patterns are arranged in parallel with each other in the rectangular direction. Therefore, the width of the resistance patterns can be expanded and the nominal current can be large. Even if the resistance patterns are printed irregularly, high reliability can be ensured on account of wide resistance patterns.

The plurality of resistance patterns may be spiral, zigzag or meander shaped, the resistance component can be large with limiting the generation of ringing. Although the inductance component may be large also, the resistance component and the inductance component are connected in series in an equivalent circuit, so that the resistance component prevents the generation or ringing.

While only certain embodiments of the present invention have been described, it will be apparent to those skilled in the art that various changes and modifications may be made therein without departing from the spirit and scope of the present invention as claimed.

What is claimed is:

1. A noise filter comprising:
   a dielectric substrate having front and rear planar surfaces;
   a plurality of resistance patterns, arranged in parallel on the front planar surface of said substrate; and
   a first ground pattern opposed to said plurality of resistance patterns and formed within said substrate immediately below said plurality of resistance patterns;
   input and output electrodes connected to opposite ends, respectively, of each of said plurality of resistance patterns;
   a second ground pattern formed on opposing edges of said substrate, said first ground pattern including opposing edges in contact with said second ground pattern, respectively;
   wherein said noise filter forms a series of RC composite elements, thereby eliminating noise input signals.

2. The noise filter as set forth in claim 1, wherein said first ground pattern is parallel to said plurality of resistance patterns.

3. The noise filter as set forth in claim 1, wherein each of said plurality of resistance patterns is spiral.

4. The noise filter as set forth in claim 1, wherein each of said plurality of resistance patterns is in meander.

5. The noise filter as set forth in claim 1, wherein each of said plurality of resistance patterns is zigzag.

6. The noise filter as set forth in claim 1, wherein said electrodes extend to the side of said substrate.

7. The noise filter as set forth in claim 1, further comprising a dielectric film formed over the plurality of resistance patterns arranged on the substrate.

8. The noise filter as set forth in claim 1, wherein each of said plurality of resistance patterns is rectangular and arranged in parallel with each other in the rectangular direction.

9. A noise filter comprising:
   a dielectric substrate having front and rear planar surfaces;
   a plurality of resistance patterns, arranged in parallel, on the front planar surface of said substrate;
   a first ground pattern opposed to said plurality of resistance patterns and formed within said substrate immediately below and parallel to said plurality of resistance patterns;
   input and output electrodes connected to opposite ends, respectively, of each of said plurality of resistance patterns, said electrodes extending to the side of said substrate;
   a dielectric film formed over the plurality of resistance patterns arranged on the substrate;
   a second ground pattern formed on opposing edges of said substrate, said first ground pattern including opposing edges in contact with said second ground pattern, respectively;
   wherein said noise filter forms a series of RC composite elements, thereby eliminating noise input signals.

10. A noise filter comprising:
    a dielectric substrate having front and rear planar surfaces;
    a first ground pattern formed within said substrate and extending to all side edges of said substrate;
    a resistance pattern opposed to said first ground pattern and arranged on the front planar surface of said substrate;
    input and output electrodes formed on one pair of opposed edges of the substrate and connected to opposite ends of said resistance pattern; and
    a second ground pattern formed on another pair of opposed edges of said substrate and connected to said first ground pattern;
    wherein said noise filter forms an RC component, thereby eliminating noise input signals.

11. The noise filter according to claim 10, wherein said first ground pattern is parallel to said resistance pattern.

12. The noise filter according to claim 10, wherein said resistance pattern is spiral.

13. The noise filter according to claim 10, wherein said resistance pattern is in meander.

14. The noise filter according to claim 10, wherein said resistance pattern is zigzag.

15. A noise filter comprising:
    a dielectric substrate having front and rear planar surfaces;
    at least two first ground patterns formed within said substrate and extending to all side edges of said substrate, said respective first ground patterns being positioned close to each of said surfaces of the substrate, respectively;
    a resistance pattern arranged on the front planar surface of said substrate opposing and parallel to either of said at least two first ground patterns;
    input and output electrodes formed on one pair of opposed edges of the substrate and connected to opposite ends of said resistance pattern; and
    a second ground pattern formed on another pair of opposed edges of said substrate and connected to said at least two first ground patterns;
    wherein said noise filter forms an RC component, thereby eliminating noise input signals.

16. The noise filter according to claim 15, wherein said at least two ground patterns are parallel to said resistance pattern.

17. The noise filter according to claim 15, wherein said resistance pattern is spiral.

18. The noise filter according to claim 15, wherein said resistance pattern is in meander.

19. The noise filter according to claim 15, wherein said resistance pattern is zig zag.

* * * * *